(12) United States Patent
Lin et al.

(10) Patent No.: US 11,985,763 B2
(45) Date of Patent: May 14, 2024

(54) ELECTRONIC DEVICE

(71) Applicant: E Ink Holdings Inc., Hsinchu (TW)

(72) Inventors: Kuan-Yi Lin, Hsinchu (TW); Chun-Yu Lu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 485 days.

(21) Appl. No.: 17/243,601

(22) Filed: Apr. 29, 2021

(65) Prior Publication Data

US 2021/0400812 A1    Dec. 23, 2021

(30) Foreign Application Priority Data

Jun. 19, 2020    (TW) ................................. 109120900

(51) Int. Cl.
| | |
|---|---|
| H05K 1/11 | (2006.01) |
| H05K 1/02 | (2006.01) |
| H05K 3/32 | (2006.01) |
| H05K 3/36 | (2006.01) |

(52) U.S. Cl.
CPC .......... H05K 1/118 (2013.01); H05K 1/0213 (2013.01); H05K 3/323 (2013.01); H05K 3/361 (2013.01)

(58) Field of Classification Search
CPC ...... H05K 1/118; H05K 1/0213; H05K 3/323; H05K 3/361
USPC ........................................................ 361/751
See application file for complete search history.

(56) References Cited

U.S. PATENT DOCUMENTS

| | | | |
|---|---|---|---|
| 7,659,136 B2 | 2/2010 | Maeda et al. | |
| 8,802,214 B2 | 8/2014 | Liang et al. | |
| 9,102,851 B2 | 8/2015 | Lee et al. | |
| 9,753,340 B2 | 9/2017 | Saitou | |
| 10,163,384 B2 | 12/2018 | So et al. | |
| 2004/0191955 A1 | 9/2004 | Joshi et al. | |
| 2017/0338198 A1* | 11/2017 | Jang | ........................ H01L 24/27 |
| 2018/0277572 A1* | 9/2018 | Yu | ........................... H01L 24/05 |
| 2020/0067026 A1* | 2/2020 | Li | ........................... H05K 1/189 |
| 2020/0212131 A1* | 7/2020 | Kim | ...................... H10K 59/126 |

FOREIGN PATENT DOCUMENTS

| | | |
|---|---|---|
| CN | 107393895 A | 11/2017 |
| CN | 109216582 A | 1/2019 |
| JP | 2000133330 A | 5/2000 |
| JP | 2008118056 A * | 5/2008 |
| WO | 2011058810 A1 | 5/2011 |

OTHER PUBLICATIONS

The office action of corresponding CN application No. 202010563199.4 dated Jun. 1, 2023.
Corresponding Taiwan office action dated Nov. 16, 2020.

* cited by examiner

*Primary Examiner* — Andargie M Aychillhum

(74) *Attorney, Agent, or Firm* — CKC & Partners Co., LLC

(57) ABSTRACT

An electronic device includes a flexible substrate, an anisotropic conductive film, and an electronic element. The flexible substrate includes an active area, a bonding pad, and a plurality of protrusions located on the bonding pad. The anisotropic conductive film includes a plurality of conductive particles. The conductive particles are in contact with the protrusions. The anisotropic conductive film is located between the bonding pad of the flexible substrate and the electronic element.

19 Claims, 9 Drawing Sheets

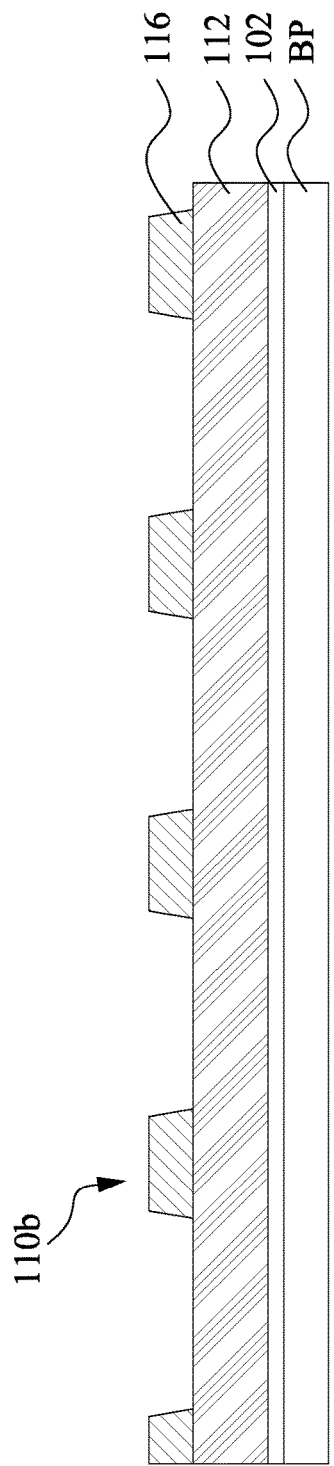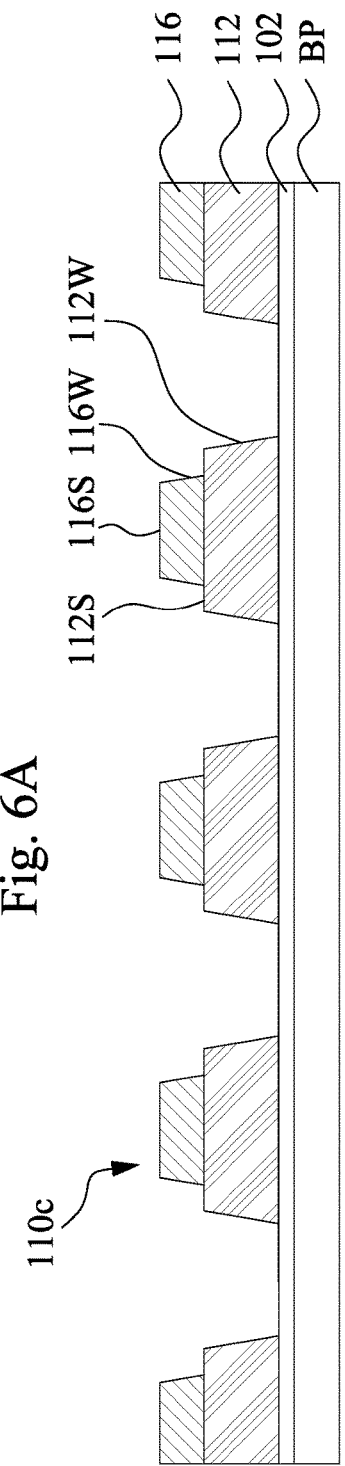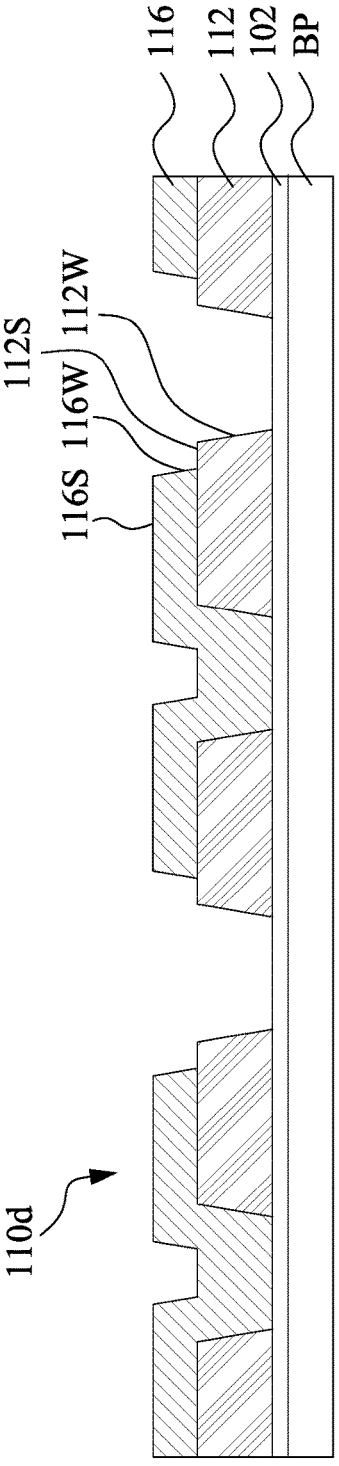

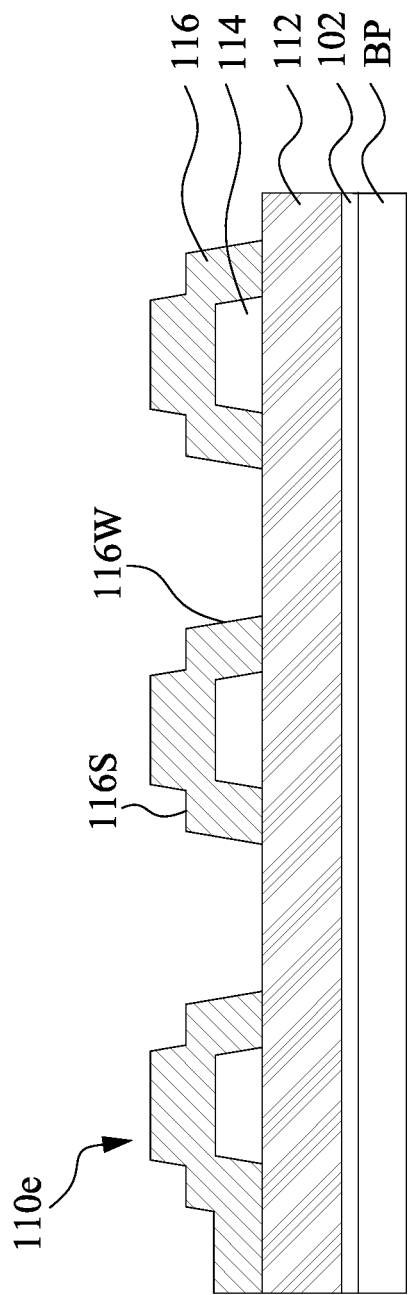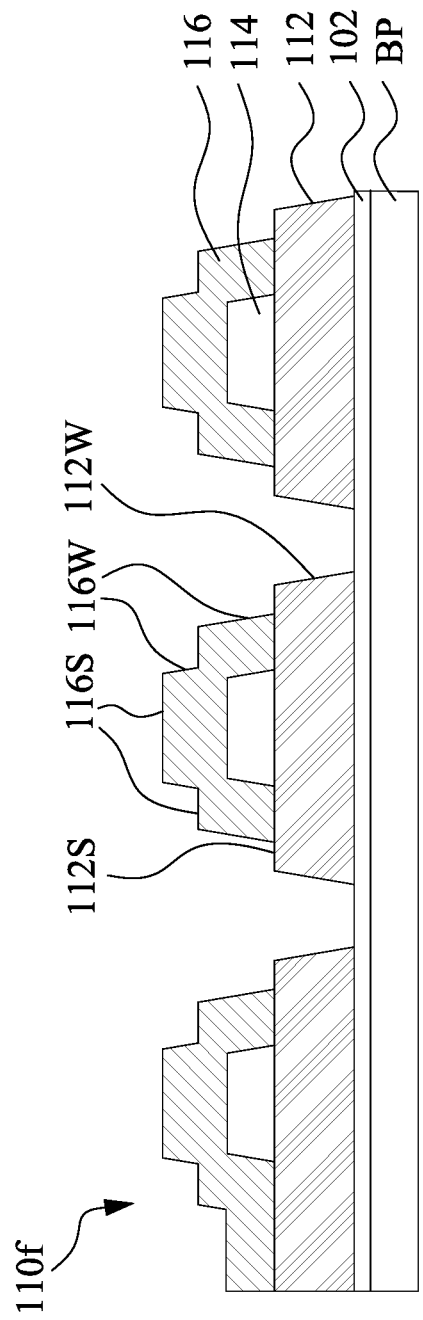

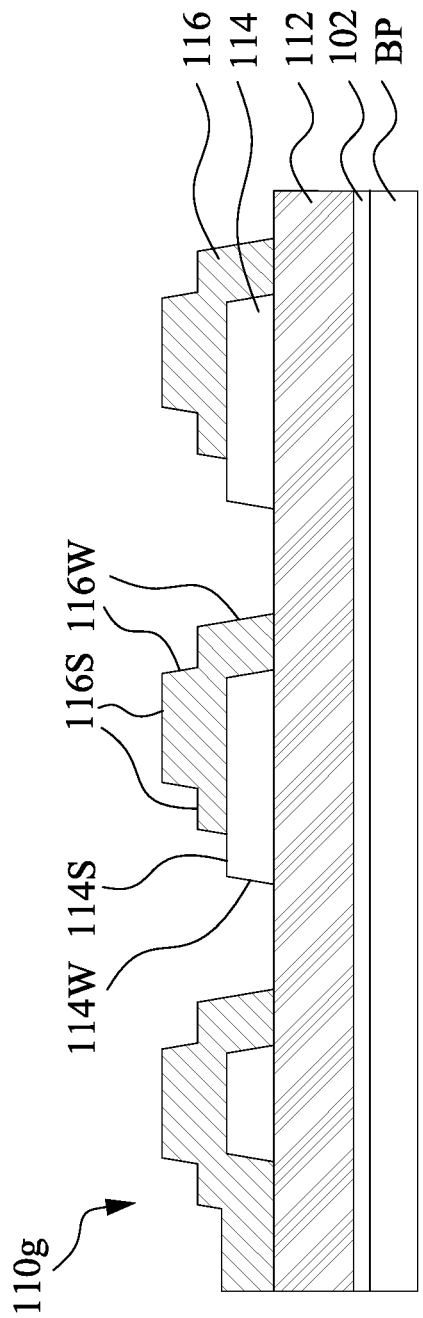

ELECTRONIC DEVICE

CROSS-REFERENCE TO RELATED APPLICATION

This application claims priority to Taiwan Application Serial Number 109120900, filed Jun. 19, 2020, which is herein incorporated by reference in its entirety.

BACKGROUND

Field of Invention

The present invention relates to an electronic device.

Description of Related Art

The bonding pad of an electronic device nowadays has a flat. In order to make the conductive particles of the anisotropic conductive film deform effectively and be in contact with the conductive layer of the bonding pad, the contact are between the conductive particles and the bonding pad must be large enough to reach the effective contact. Therefore, a greater bonding pressure is required to ensure that the effective contact can be formed between the conductive particles and the bonding pad. For the electronic device that utilizes a flexible substrate, the bonding pad of the flexible substrate may collapse due to such greater bonding pressure.

Accordingly, it is still a development direction for the industry to provide a flexible substrate that may prevent the flexible substrate from collapsing due to the bonding pressure.

SUMMARY

The invention provides an electronic device.

In some embodiments, the electronic device includes a flexible substrate, an anisotropic conductive film, and an electronic element. The flexible substrate includes an active area, a bonding pad, and a plurality of protrusions located on the bonding pad. The anisotropic conductive film includes a plurality of conductive particles. The conductive particles are in contact with the protrusions. The anisotropic conductive film is located between the bonding pad of the flexible substrate and the electronic element.

In some embodiments, each of the protrusions has a width, and the width is located in a range from about 1 um (micrometer) to 2 um.

In some embodiments, each of the protrusions has a height, and the height is located in a range from about 0.1 um to 1 um.

In some embodiments, adjacent two of the protrusions have an interval therebetween, and the interval is located in a range from about 1.2 um to 2 um.

In some embodiments, each of the protrusions has a width, each of the conductive particles has a diameter, the width is greater than 20% of the diameter, and the width is three times smaller than the diameter.

In some embodiments, each of the protrusions has a height, each of the conductive particles has a diameter, the height is 5% greater than the diameter, and the height is smaller than 30% of the diameter.

In some embodiments, adjacent two of the protrusions have an interval therebetween, each of the conductive particles has a diameter, the interval is greater than 50% of the diameter of the conductive element, and the interval is smaller than three times of the diameter of the conductive particle.

In some embodiments, the conductive particles have a deformation greater than 15%.

In some embodiments, each of the protrusion has a passivation layer, the passivation layer has a thickness located in a range from about 0.3 um to 0.4 um.

In some embodiments, the passivation layer has a plurality of sections.

In some embodiments, each of the protrusions has a gate insulation layer, the gate insulation layer has a thickness located in a range from about 0.3 um to 0.4 um.

In some embodiments, the gate insulation layer has a plurality of sections.

In some embodiments, orthogonal projections of the sections of the gate insulation layer on the bonding pad are respectively overlapped with the sections of the gate insulation layer.

In some embodiments, a portion of the passivation layer is located between adjacent two of the sections of the gate insulation layer and extends onto the bonding pad.

In some embodiments, each of the protrusions further includes an amorphous silicon layer located between the passivation layer and the gate insulation layer, and the amorphous silicon layer has a thickness located in a range from about 0.05 um to 0.15 um.

In some embodiments, the passivation layer has a plurality of sections, and the amorphous silicon layer has a plurality of sections.

In some embodiments, orthogonal projections of the sections of the passivation layer on the bonding pad are at least partially overlapped with the orthogonal projections of the sections of the amorphous silicon layer on the bonding pad.

In some embodiments, the gate insulation layer has a plurality of sections, and the orthogonal projections of the sections of the passivation layer on the bonding pad are overlapped with the sections of the gate insulation layer, and the orthogonal projections of the sections of the amorphous silicon layer on the bonding pad are overlapped with the sections of the gate insulation layer.

In some embodiments, each of the protrusions further includes a gate insulation layer and an amorphous silicon layer, the amorphous silicon layer is located between the passivation layer and the gate insulation layer, the gate insulation layer has a plurality of sections, and the amorphous silicon layer has a plurality of sections.

In some embodiments, a portion of the passivation layer is located between adjacent two of the sections of the gate insulation layer and extends onto the bonding pad.

In the aforementioned embodiments, the contact area between the conductive particles of the anisotropic conductive film and the flexible substrate may be increased by disposing the protrusions on the bonding pad BP of the flexible substrate. In other words, deformation of the conductive particles may be increased by making the conductive particles be in contact with the protrusions, thereby enhancing the bonding stability between the electronic element and the flexible substrate. In addition, in the embodiments that the conductive particles have insulation layers, the insulation layers may be broken more easily by disposing the protrusions. As such, in the bonding process, the external force applied for effective contact between the electronic element and the flexible substrate may be reduced, thereby preventing the bonding pad of the flexible substrate from collapsing.

BRIEF DESCRIPTION OF THE DRAWINGS

The invention can be more fully understood by reading the following detailed description of the embodiment, with reference made to the accompanying drawings as follows:

FIG. 5 is a partial enlarged view of the protrusions and the bonding pad in

FIG. 3; and

FIGS. 6A to 6F are cross-sectional views of the protrusions and the bonding pad according to various embodiments of the present disclosure.

DETAILED DESCRIPTION

Figure 1:
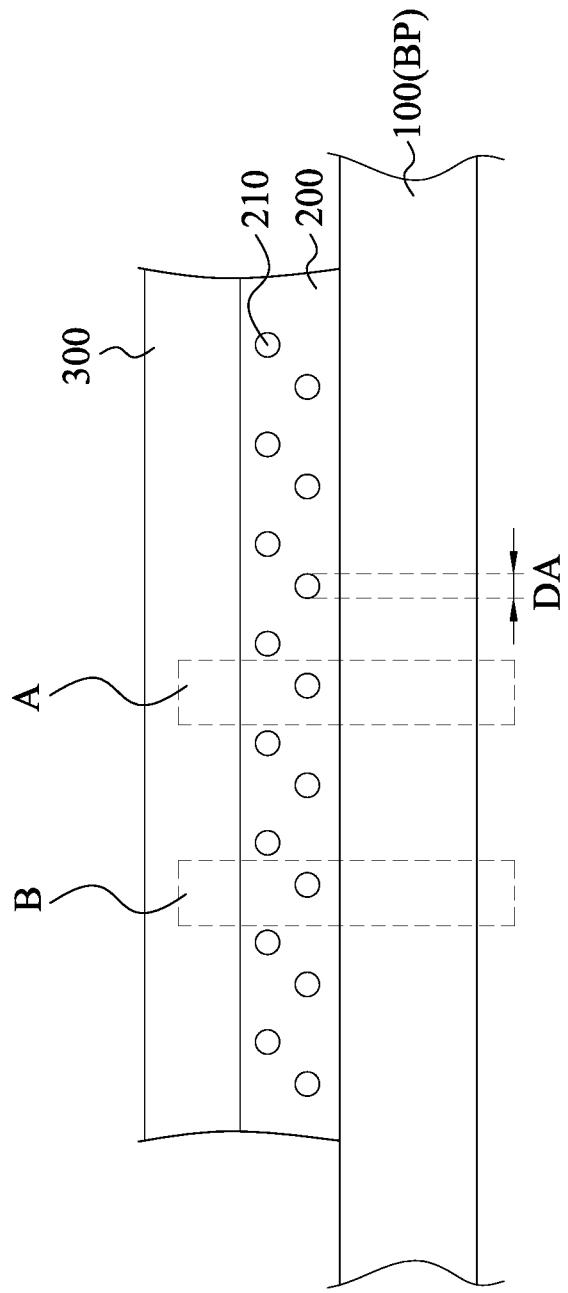
FIG. 1 is a cross-sectional view of an electronic device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2A:
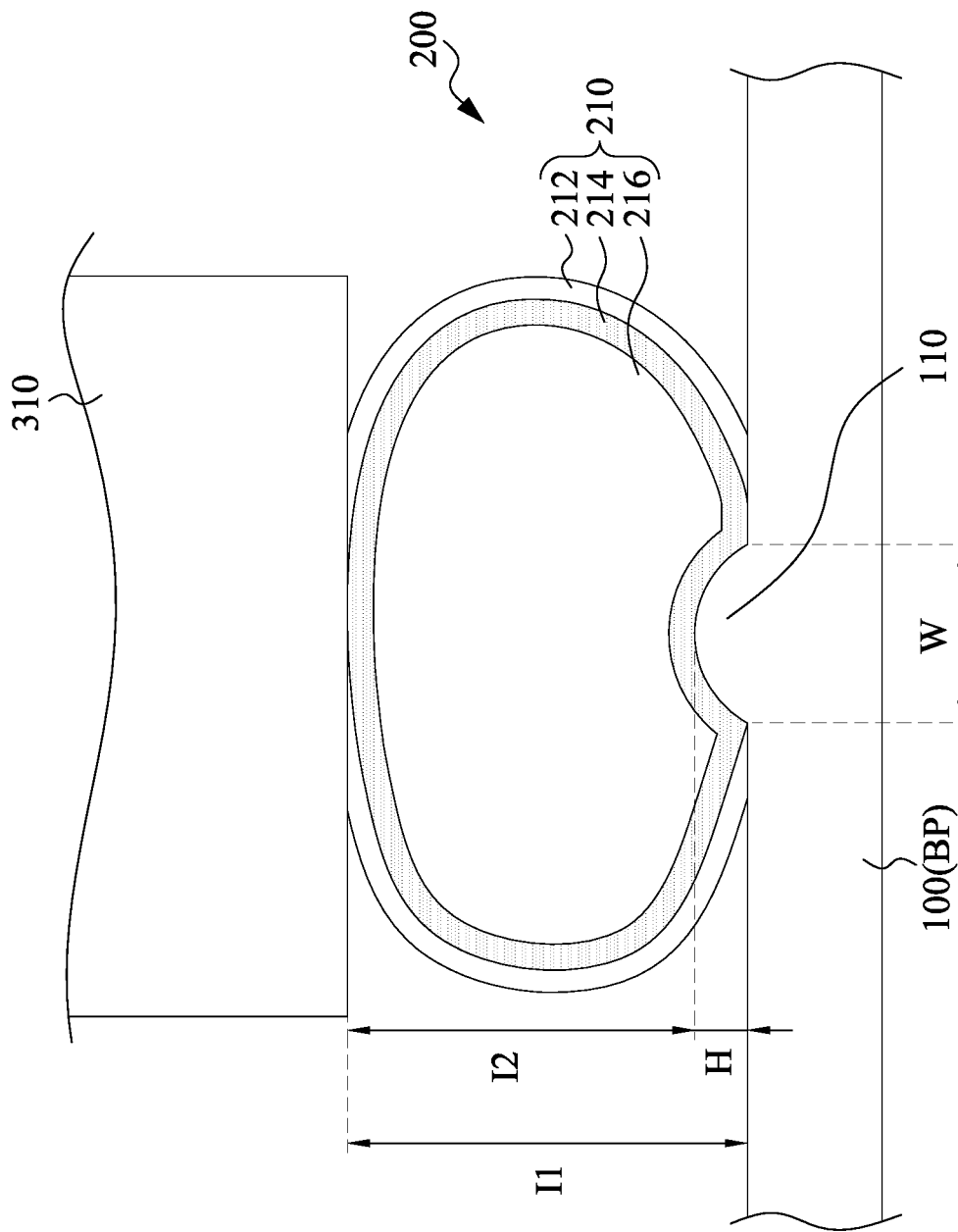
FIG. 2A is an enlarged view of the region A in FIG. 1.

FIG. 1 is a cross-sectional view of an electronic device 10 according to one embodiment of the present disclosure. The electronic device 10 includes a flexible substrate 100, an anisotropic conductive film 200, and an electronic element 300. FIG. 2A is an enlarged view of the region A in FIG. 1. Reference is made to FIG. 1 and FIG. 2A. The flexible substrate 100 includes a bonding pad BP and protrusions 110 located on the bonding pad BP. The anisotropic conductive film 200 includes a plurality of conductive particles 210. The conductive particles 210 are in contact with the protrusions 110. The anisotropic conductive film 200 is located between the bonding pad BP of the flexible substrate 100 and the electronic element 300. The flexible substrate 100 and the electronic element 300 are adhered with each other and are electrically connected with each other through the anisotropic conductive film 200. The electronic element 300 includes electrical connection element 310. As shown in FIG. 2A, when the electronic element 300 is bonded with the flexible substrate 100 through the bonding process, the electrical connection element 310 and the bonding pad BP may push the conductive particles 210 such that the electrical connection element 310 and the conductive layer on the bonding pad BP (as shown by the metal layer 106 in FIG. 3) are electrically connected with the circuits between the electronic element 300 and the flexible substrate 100 through the conductive particles 210.

The flexible substrate 100, for example, may be Polyimide (PI), Polyester (PET), flexible composite material of PI and glass, flexible composite material of PET and glass, or flexible composite material of PI, optical clear adhesive, and PET. The electronic element 300, for example, may be Integrated Circuit (IC) or Flexible Printed Circuit (FPC).

The electrical connection element 310, for example, may be gold bump, solder bump, conductive pillar, or other element used for electrical connection.

The conductive element 210 includes an insulation layer 212, a metal layer 214, and resin 216. The core of the conductive particle 210 includes resin 216, and the metal layer 214 wraps the resin 216. The metal layer 214, for example, may be formed by at least one of the Au, Ag, Cu, Ni, and Ni Alloy. The insulation layer 212 warps the metal layer 214 and the resin 216, but the disclosure is not limited in these regards. In some embodiments, the conductive elements 210 may have no insulation layer 212.

As shown in FIG. 2A, the contact area between the conductive particles 210 and the flexible substrate 100 may be increased by disposing the protrusions 110 on the bonding pad BP of the flexible substrate 100. In other words, deformation of the conductive particles 210 may be increased by making the conductive particles 210 be in contact with the protrusions 110, thereby enhancing the bonding stability between the electronic element 300 and the flexible substrate 100. In one embodiment, the deformation of the conductive particle 210 is greater than 15% so as to enhance the bonding stability between the electronic element 300 and the flexible substrate 100. In addition, in the embodiments that the conductive particles 210 have insulation layers 212, the insulation layers 212 may be broken more easily by disposing the protrusions 110. As such, in the bonding process, the external force applied for effective contact between the electronic element 300 and the flexible substrate 100 may be reduced, thereby preventing the bonding pad BP of the flexible substrate 100 from collapsing.

As shown in FIG. 2A, the protrusion 110 has a width W, and the width W is located in a range from about 1 um to 2 um. The protrusion 110 has a height H, and the height H is located in a range from about 0.1 um to 1 um. When the electronic element 300 and the flexible substrate 100 are bonded through the bonding process, the electrical connection element 310 of the electronic element 300 and the bonding pad BP of the flexible substrate 100 have an interval 11 therebetween. The electrical connection element 310 of the electronic element 300 and the top of the protrusion 110 have an interval 12 therebetween, and the interval 12 is smaller than the interval 11. Such structure may overcome the elastic recovery problem of the conductive particles 210 during the environmental test or after the electronic device 10 has been used for a long time. In other words, since the interval 12 between the electrical connection element 310 and the top of the protrusion 110 is smaller, the contact area between the conductive particles 210 and the flexible substrate 100 can be ensured to maintain the effective contact and the effective electrical connection between the electronic element 300 and the flexible substrate 100 even the interval 11 between the electrical connection element 310 and the bonding pad BP may increase through time or due to environmental change.

Figure 2B:
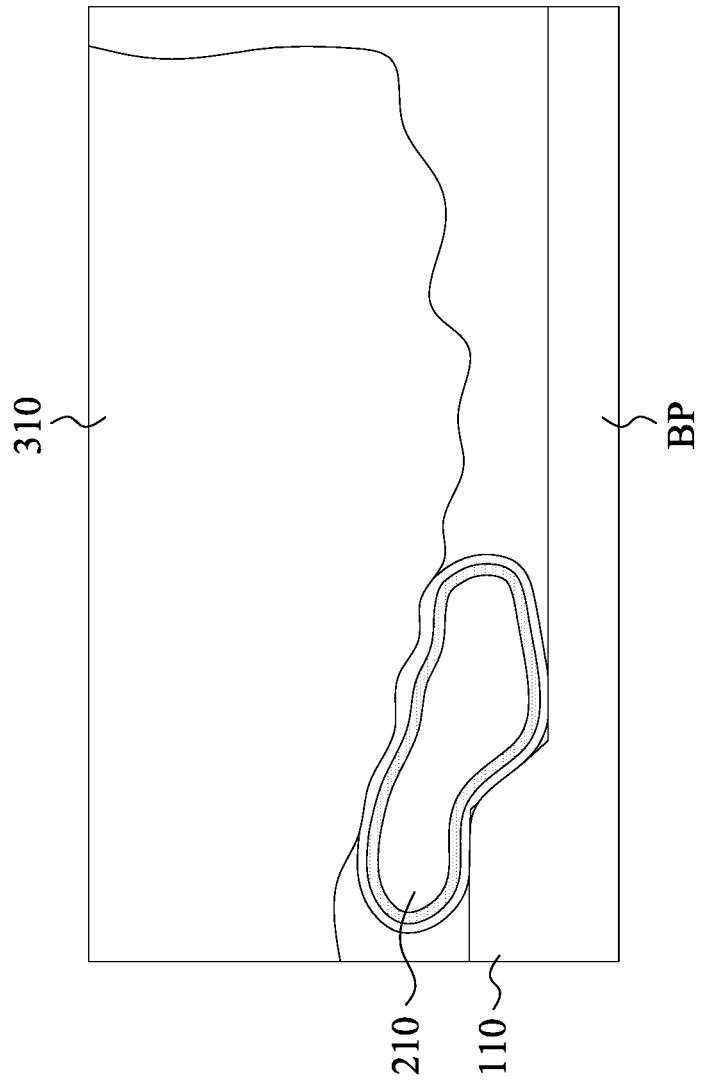
FIG. 2B is an enlarged view of the region B in FIG. 1.

FIG. 2B is an enlarged view of the region B in FIG. 1. A part of the conductive particle 210 may be in contact with the protrusion 110, and another part of the conductive particle 210 may be located above the bonding pad BP without the protrusion 110. However, the protrusion 110 can be pushed by taking advantage of the height difference formed by the protrusion 110. In other words, it is not necessary for the protrusion 110 to be covered completely by the conductive particle 210 to provide the advantage of increasing the contact area between the conductive particle 210 and the flexible substrate 100. Accordingly, the size of the protrusion 110 may not be smaller than the size of the conductive particle 210, as long as the protrusion 110 on the bonding pad BP can increase the deformation of the conductive particle 210. The relation between the size of the protrusion 110 and the size of the conductive particle 210 will be described in the following paragraphs.

Figure 3:
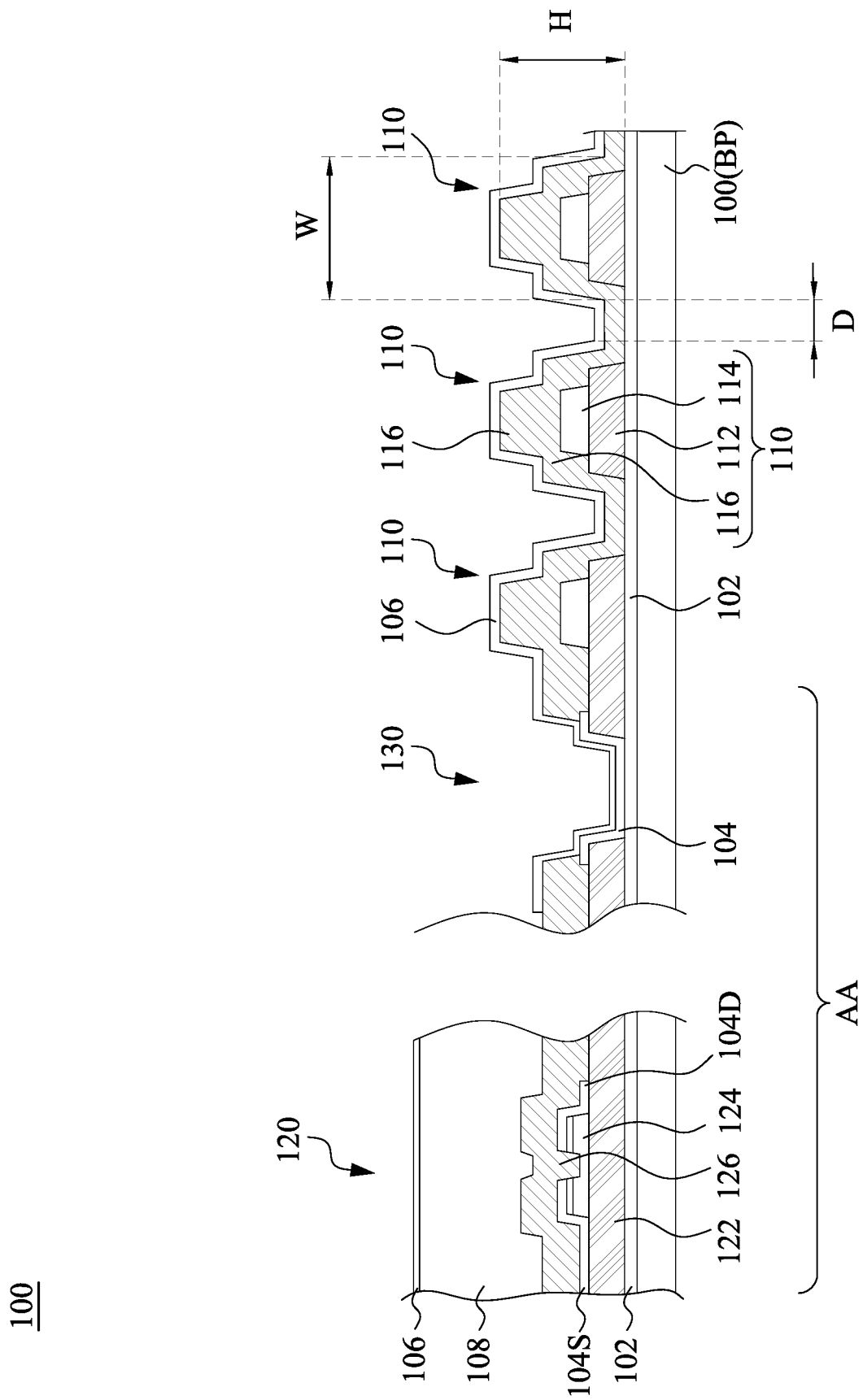
FIG. 3 is a cross-sectional view of a flexible substrate according to one embodiment of the present disclosure.

FIG. 3 is a cross-sectional view of a flexible substrate 100 according to one embodiment of the present disclosure. The flexible substrate 100 further includes an active region AA. In the present embodiment, the flexible substrate 100 includes a plurality of protrusions 110 on the bonding pad BP. Adjacent two of the protrusions 110 have an interval D therebetween, and the interval D is located in a range from about 1.2 um to 2 um.

Reference is made to FIG. 1 and FIG. 3, the conductive particle 210 has a diameter DA. In some embodiments, the diameter DA of the conductive particle 210 is located in a range from about 3 um to 10 um, but the present disclosure is not limited in this regard. Users may choose suitable size of the conductive particle 210 depend on requirements. The width W of the conductive particle 210 is greater than 20% of the diameter DA, and the width W is smaller than three times of the diameter DA. The height H of the conductive particle 210 is greater than 5% of the diameter DA, and the height H is smaller than 30% of the diameter DA. Such structure design may confirm that the contact area between the conductive particle 210 and the flexible substrate 100 is enough to maintain the effective contact and the effective electrical connection between the electronic element 300 and the flexible substrate 100. The interval D of the conductive particle 210 is greater than 50% of the diameter DA of the conductive particle 210, and the diameter D is smaller than three times of the diameter DA of the conductive particle 210. Such structure design may confirm that the conductive particle 210 may be in contact with the protrusions 110 such that the conductive particle 210 may have greater deformation (see FIG. 2A and FIG. 2B).

Reference is made to FIG. 3, each of the protrusions 110 includes a gate insulation layer 112, an amorphous silicon layer 114, and a passivation layer 116. The amorphous silicon layer 114 is located between the passivation layer 116 and the gate insulation layer 112. The amorphous silicon layer 114 is in contact with the gate insulation layer 112 and the passivation layer 116. The active region AA has an active array 120. The active array 120 has a gate insulation layer 122, an amorphous silicon layer 124, and a passivation layer 126. The gate insulation layer 122 of the active region AA extends onto the gate insulation layer 112 on the bonding pad BP. The gate insulation layer 122 of the active region AA and the gate insulation layer 112 on the bonding pad BP may be formed in the same process step. The amorphous silicon layer 124 of the active region AA and the amorphous silicon layer 114 on the bonding pad BP may also be formed in the same process step. The passivation layer 126 of the active region AA and the passivation layer 116 on the bonding pad BP may also be formed in the same process step. There is a second metal layer 104S, 104D disposed between the amorphous silicon layer 124 and the passivation layer 126 of the active region AA. The second metal layer 104S, 104D are respectively a source and a drain of the thin film transistor (TFT) of the active region AA.

There is a first metal layer 102 between the flexible substrate 100 and the gate insulation layer 112, and the first metal layer 102 is located on the active region AA and the bonding pad BP. There is a third metal layer 106 such as the transparent conductive film disposed on the passivation layer 116 of each of the protrusions 110 and the passivation layer 126 of the active region AA. For example, the third metal layer 106 may be Indium zinc oxide (IZO), Indium tin oxide (ITO), or other transparent metal oxide film. There is a protection layer 108 between the passivation layer 126 of the active region AA and the third metal layer 106. The active region AA further includes a contact hole 130, and the first metal layer 102, the second metal layer 104, and the third metal layer 106 of the contact hole 140 are in contact with each other.

Accordingly, during the process of forming the active array 120, the gate insulation layer 112, the amorphous silicon layer 114, and the passivation layer 116 that have patterns different from the active region AA can be formed on the bonding pad BP through patterning process. In other words, there is no need to increase fabrication step but merely adjust design of the original mask to form the protrusion 110.

Figure 4B:
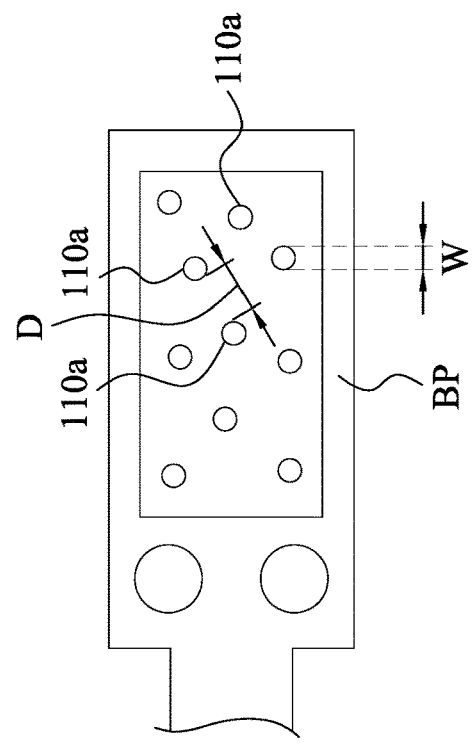
FIG. 4B is a top view of a flexible substrate according to one embodiment of the present disclosure, wherein a portion of the active layer is omitted.
Figure 4A:
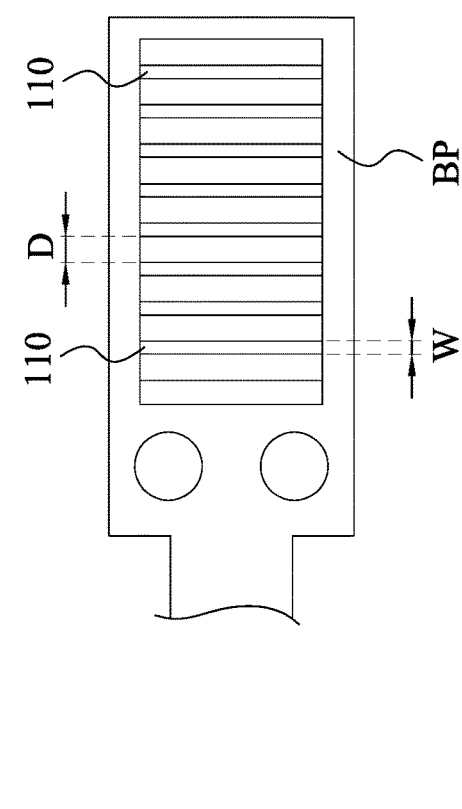
FIG. 4A is a top view of a flexible substrate according to one embodiment of the present disclosure, wherein a portion of the active layer is omitted.

FIG. 4A is a top view of a flexible substrate 100 according to one embodiment of the present disclosure, wherein a portion of the active layer AA (see FIG. 3) is omitted. In the present embodiment, each of the protrusions 110 has a stripe shape and extends along the first direction D1. Adjacent two protrusions have an interval D therebetween along the second direction D2. The second direction D2 is different from the first direction D1. In the present embodiment, the second direction D2 is substantially perpendicular to the first direction D1.

FIG. 4B is a top view of a flexible substrate 100a according to one embodiment of the present disclosure, wherein a portion of the active layer AA (see FIG. 3) is omitted. In the present embodiment, each of the protrusions 110a has an island shape. The width W of the protrusion 110a is substantially the diameter of the protrusion 110a. Adjacent two of the protrusions 110a have an interval D therebetween.

Figure 5:
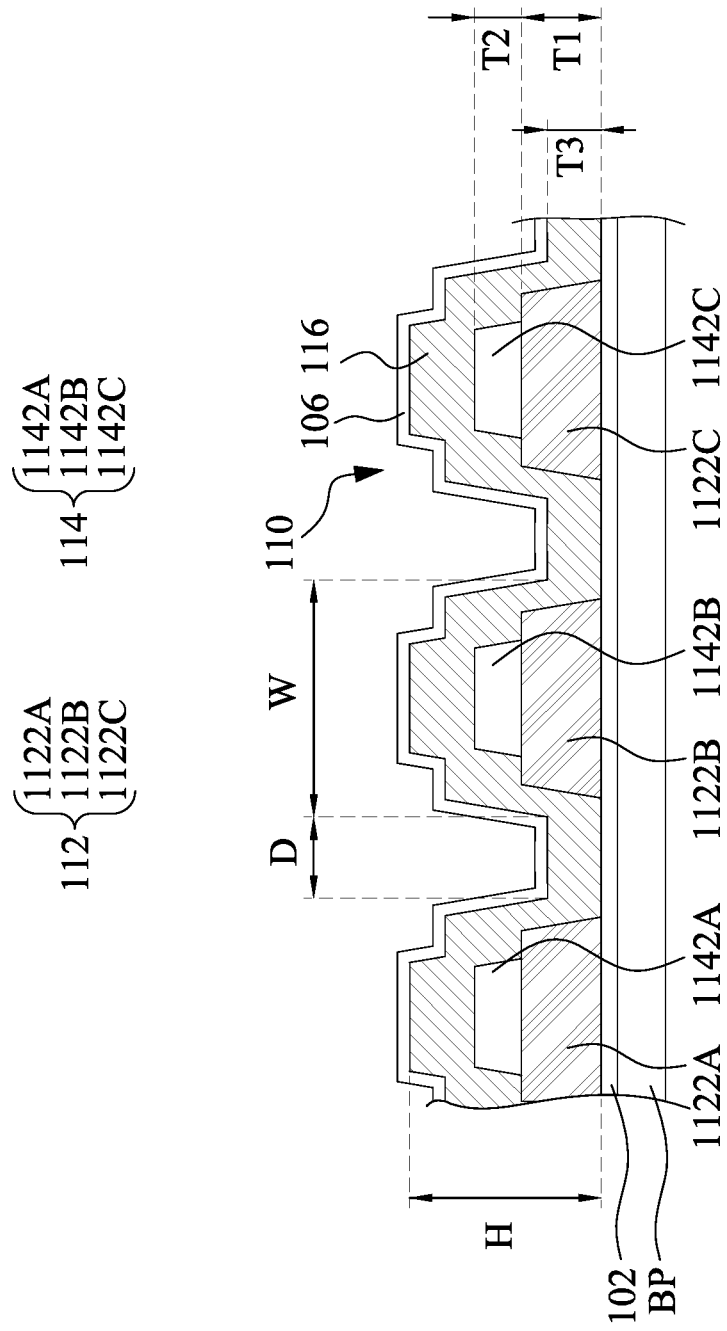

FIG. 5 is a partial enlarged view of the protrusions 110 and the bonding pad BP in FIG. 3. In the present embodiments, the gate insulation layer 112 of each of the protrusions 110 includes sections 1122A, 1122B, 1122C. The amorphous silicon layer 114 of each of the protrusions 110 includes sections 1142A, 1142B, 1142C. The positions of the sections 1122A, 1122B, 1122C respectively correspond to the sections 1142A, 1142B, 1142C. In addition, the orthogonal projection of the amorphous silicon layer 114 on the bonding pad BP is overlapped with the gate insulation layer 112. A portion of the passivation 116 is located between adjacent two of the sections 1122A, 1122B, 1122C of the gate insulation layer 112, and this portion of the passivation layer 116 extends onto the bonding pad BP. As shown in FIG. 5, the portion of the passivation layer 116 extending onto the bonding pad BP is in contact with the first metal layer 102. In the present embodiment, the passivation layer 116 covers and is in contact with the amorphous silicon layer 114, the gate insulation layer 112, and the first metal layer 102. The gate insulation layer 112 has a thickness T1 located in a range from about 0.3 um to 0.4 um. The amorphous silicon layer 114 has a thickness T2 located in a range from about 0.05 um to 0.15 um. The passivation layer 116 has a thickness T3 located in a range from about 0.3 um to 0.4 um. The aforementioned thickness may be determined depends on the requirements for the active layer AA, and there is no need to adjust the steps of depositing the material of aforementioned structures.

FIGS. 6A to 6F are cross-sectional views of the protrusions and the bonding pad BP according to various embodiments of the present disclosure. As shown in FIG. 6A, the passivation layer 116 of the protrusions 110b has a plurality of sections, but has no amorphous layer 114 as shown in FIG. 5. The gate insulation layer 112 covers and is in contact with the first metal layer 102 and the bonding pad BP.

Reference is made to FIG. 6B. The passivation layer 116 and the gate insulation layer 112 of the protrusion 110c respectively have a plurality of sections, but have no amorphous layer 114 as shown in FIG. 5. The orthogonal projection of the section of the passivation layer 116 on the bonding pad BP is overlapped with the section 112 of the gate insulation layer 112. In addition, the width of the passivation layer 116 is smaller than the width of the gate insulation layer 112, thereby forming the protrusions 110c with stepped shape. In the present embodiment, the top surface 116S of the passivation layer 116, the side wall 116W of the passivation layer 116, a portion of the top surface 112S of the gate insulation layer 112, and the side wall 112W of the gate insulation layer 112 form the profile of the protrusion 110c with stepped shape. The protrusion 110c with stepped shape is beneficial to break the insulation layer 212 of the conductive particles 210 so as to increase the bonding stability between the conductive particles 210 (see FIG. 2A, the insulation layer 212 may be included or excluded) and the bonding pad BP.

Reference is made to FIG. 6C. The gate insulation layer 112 and the passivation layer 116 of the protrusion 110d respectively have a plurality of sections. A portion of the section of the passivation layer 116 is located between adjacent two sections of the gate insulation layer 112 and extends onto the bonding pad BP. In the present embodiment, the section of the passivation layer 116 extending onto the bonding pad BP is in contact with the first metal layer 102. In other words, in the present embodiment, the sections of the two gate insulation layer 112 and the section of the passivation layer 116 form the protrusion 110d with symmetrical shape. In the present embodiment, the top surface 116S of the passivation layer 116, the side wall 116W of the passivation layer 116, a portion of the top surface 112S of the gate insulation layer 112, and a side wall 112W of one side of the gate insulation layer 112 form the stepped shape profile of the protrusion 110d. The protrusion 110d with stepped profile and the protrusion 110c as shown in FIG. 6B have the same advantages, and the description is not repeated hereinafter.

Reference is made to FIG. 6D. The amorphous layer 114 and the passivation layer 116 of the protrusion 110e respectively have a plurality of sections. The gate insulation layer 112 covers and is in contact with the first metal layer 102 and the bonding pad BP. In the present embodiment, the width of the section of the passivation layer 116 is greater than the width of the section of the amorphous layer 114, and the passivation layer 116 and the gate insulation layer 112 surround the amorphous layer 114. The stepped shape of the section of the passivation layer 116 is formed through the pattern of the amorphous layer 114, thereby forming the protrusion 110e with stepped shape. In the present embodiment, the top surface 116S and the side wall 116W of the passivation layer 116 form the stepped shape profile of the protrusion 110e. The protrusion 110e with stepped shape and the protrusion 110c as shown in FIG. 6B have the same advantages, and the description is not repeated hereinafter.

Reference is made to FIG. 6E. The protrusion 110f is substantially the same as the protrusion 110e in FIG. 6D, and the difference is that the gate insulation layer 112 of the protrusion 110f has a plurality of sections. The orthogonal projections of the sections of the passivation layer 116 on the bonding pad BP are overlapped with the sections of the gate insulation layer 112, and the orthogonal projections of the sections of the amorphous layer 114 on the bonding pad BP are overlapped with the sections of the gate insulation layer 112. In the present embodiment, the width of the gate insulation layer 112 is greater than the widths of the amorphous layer 114 and the passivation layer 116, thereby forming the protrusion 110f with the stepped shape. In the present embodiment, the top surface 116S and the side wall 116W of the passivation layer 116, a portion of the top surface 112S of the gate insulation layer 112, and a side wall 112W of one side of the gate insulation layer 112 form the three-layer stepped shape profile of the protrusion 110e, but the present disclosure is not limited in this regard. In some other embodiments, there may be other process utilized to form the stepped shape structure with more layers. For example, a half-tone mask may be used to form different etching depth, so as to form protrusions having stepped shape with more layers. The protrusion 110f with stepped shape and the protrusion 110e as shown in FIG. 6D have the same advantages, and the description is not repeated hereinafter.

Reference is made to FIG. 6F. The protrusion 110g is substantially the same as the protrusion 110e in FIG. 6F, and the difference is that the orthogonal projection of the section of the passivation layer 116 of the protrusion 110g on the bonding pad BP is at least partially overlapped with the orthogonal projection of the section of the amorphous layer 114 on the bonding pad. For example, the section of the passivation layer 116 at the left had side of FIG. 6F completely covers the underlying section of the amorphous layer 114, but the sections of the passivation at the right hand side and the middle of FIG. 6F merely cover a portion of the section of the amorphous layer 114. Therefore, the passivation layer 116 at the right hand side and the middle of FIG. 6F and the amorphous layer 114 collectively form the protrusion 110g with asymmetrical stepped shape. The top surface 116S and the side wall 116W of the passivation layer 116, a portion of the top surface 114S of the amorphous layer 114, and a side wall 114W of one side of the amorphous layer 114 form the three-layer stepped shape profile of the protrusion 110g at the right hand side and middle of FIG. 6F, but the present disclosure is not limited in this regard. The protrusion 110g with stepped shape and the protrusion 110e as shown in FIG. 6D have the same advantages, and the description is not repeated hereinafter.

As described above, the contact area between the conductive particles and the flexible substrate may be increased by disposing the protrusions on the bonding pad BP of the flexible substrate. In other words, deformation of the conductive particles may be increased by making the conductive particles be in contact with the protrusions, thereby enhancing the bonding stability between the electronic element and the flexible substrate. In addition, in the embodiments that the conductive particles have insulation layers, the insulation layers may be broken more easily by disposing the protrusions. As such, in the bonding process, the external force applied for effective contact between the electronic element and the flexible substrate may be reduced, thereby preventing the bonding pad of the flexible substrate from collapsing.

In addition, since the interval between the electrical connection element and the top of the protrusion is smaller, the contact area between the conductive particles and the flexible substrate can be ensured to maintain the effective contact and the effective electrical connection between the electronic element and the flexible substrate even the interval I1 between the electrical connection element and the bonding pad may increase through time or due to environmental change.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electronic device, comprising:
a flexible substrate having an active region, a bonding pad, and a plurality of protrusions located on the bonding pad, wherein adjacent two of the protrusions have an interval therebetween;
an anisotropic conductive film having a plurality of conductive particles, wherein the conductive particles are in contact with the protrusions, each of the conductive particles has a diameter, the interval is greater than 50% of the diameter of the conductive particles and the interval is smaller than three times of the diameter of the conductive particles; and
an electronic element, wherein the anisotropic conductive film is located between the bonding pad of the flexible substrate and the electronic element.

2. The electronic device of claim 1, wherein each of the protrusions has a width, and the width is located in a range from about 1 um (micrometer) to 2 um.

3. The electronic device of claim 1, wherein each of the protrusions has a height, and the height is located in a range from about 0.1 um to 1 um.

4. The electronic device of claim 1, wherein adjacent two of the protrusions have an interval therebetween, and the interval is located in a range from about 1.2 um to 2 um.

5. The electronic device of claim 1, wherein each of the protrusions has a width, each of the conductive particles has a diameter, the width is greater than 20% of the diameter, and the width is three times smaller than the diameter.

6. The electronic device of claim 1, wherein each of the protrusions has a height, each of the conductive particles has a diameter, the height is 5% greater than the diameter, and the height is smaller than 30% of the diameter.

7. The electronic device of claim 1, wherein the conductive particles have a deformation greater than 15%.

8. The electronic device of claim 1, wherein each of the protrusions has a passivation layer, the passivation layer has a thickness located in a range from about 0.3 um to 0.4 um.

9. The electronic device of claim 8, wherein the passivation layer has a plurality of sections.

10. The electronic device of claim 9, wherein each of the protrusions has a gate insulation layer, the gate insulation layer has a thickness located in a range from about 0.3 um to 0.4 um.

11. The electronic device of claim 10, wherein the gate insulation layer has a plurality of sections.

12. The electronic device of claim 11, wherein orthogonal projections of the sections of the passivation layer on the bonding pad are respectively overlapped with the sections of the gate insulation layer.

13. The electronic device of claim 11, wherein a portion of the passivation layer is located between adjacent two of the sections of the gate insulation layer and extends onto the bonding pad.

14. The electronic device of claim 10, wherein each of the protrusions further comprises an amorphous silicon layer located between the passivation layer and the gate insulation layer, and the amorphous silicon layer has a thickness located in a range from about 0.05 um to 0.15 um.

15. The electronic device of claim 14, wherein the passivation layer has a plurality of sections, and the amorphous silicon layer has a plurality of sections.

16. The electronic device of claim 15, wherein orthogonal projections of the sections of the passivation layer on the bonding pad are at least partially overlapped with the orthogonal projections of the sections of the amorphous silicon layer on the bonding pad.

17. The electronic device of claim 16, wherein the gate insulation layer has a plurality of sections, and the orthogonal projections of the sections of the passivation layer on the bonding pad are overlapped with the sections of the gate insulation layer, and the orthogonal projections of the sections of the amorphous silicon layer on the bonding pad are overlapped with the sections of the gate insulation layer.

18. The electronic device of claim 9, wherein each of the protrusions further comprises a gate insulation layer and an amorphous silicon layer, the amorphous silicon layer is located between the passivation layer and the gate insulation layer, the gate insulation layer has a plurality of sections, and the amorphous silicon layer has a plurality of sections.

19. The electronic device of claim 18, wherein a portion of the passivation layer is located between adjacent two of the sections of the gate insulation layer and extends onto the bonding pad.

* * * * *